(12) United States Patent
Williamson

(10) Patent No.: US 7,057,395 B1
(45) Date of Patent: Jun. 6, 2006

(54) METHOD FOR DIAGNOSING OPEN DEFECTS ON NON-CONTACTED NODES OF AN ELECTRONIC DEVICE FROM MEASUREMENTS OF CAPACITIVELY COUPLED NODES

(75) Inventor: Eddie Williamson, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/074,238

(22) Filed: Mar. 4, 2005

(51) Int. Cl.
*G01R 31/08* (2006.01)

(52) U.S. Cl. ............... 324/519; 324/530; 324/531; 324/763; 324/765

(58) Field of Classification Search ............ 324/519
See application file for complete search history.

(56) References Cited

U.S. PATENT DOCUMENTS

| | | | |
|---|---|---|---|
| 5,110,477 A * | 5/1992 | Howard et al. | 210/647 |
| 5,391,993 A * | 2/1995 | Khazam et al. | 324/684 |
| 5,420,500 A | 5/1995 | Kerschner | |
| 5,498,964 A | 3/1996 | Kerschner et al. | |
| 5,557,209 A | 9/1996 | Crook et al. | |
| 6,005,394 A * | 12/1999 | Majka et al. | 324/519 |
| 6,536,007 B1 * | 3/2003 | Venkataraman | 714/724 |
| 6,717,415 B1 * | 4/2004 | Sunter | 324/519 |
| 2003/0231028 A1 * | 12/2003 | Liu | 324/765 |
| 2005/0099186 A1 * | 5/2005 | Parker et al. | 324/538 |

* cited by examiner

*Primary Examiner*—Anjan Deb
*Assistant Examiner*—John Zhu

(57) ABSTRACT

A method and apparatus for diagnosing open defects on non-contacted nodes of an electrical device is presented. Actual and expected signal measurements are collected for various contacted nodes of the electrical device. Nodes whose actual measurements are out of range of their respective expected measurements are deemed abnormal nodes. Non-contacted nodes may then be assessed as having, or as likely to have, open defects based on knowledge of the degree of coupling of the non-contacted node to the abnormal contacted nodes. In the preferred embodiment, abnormal nodes are identified using a linear regression analysis, and the non-contacted nodes indicted as having open defects are identified using a weighting scheme.

18 Claims, 7 Drawing Sheets

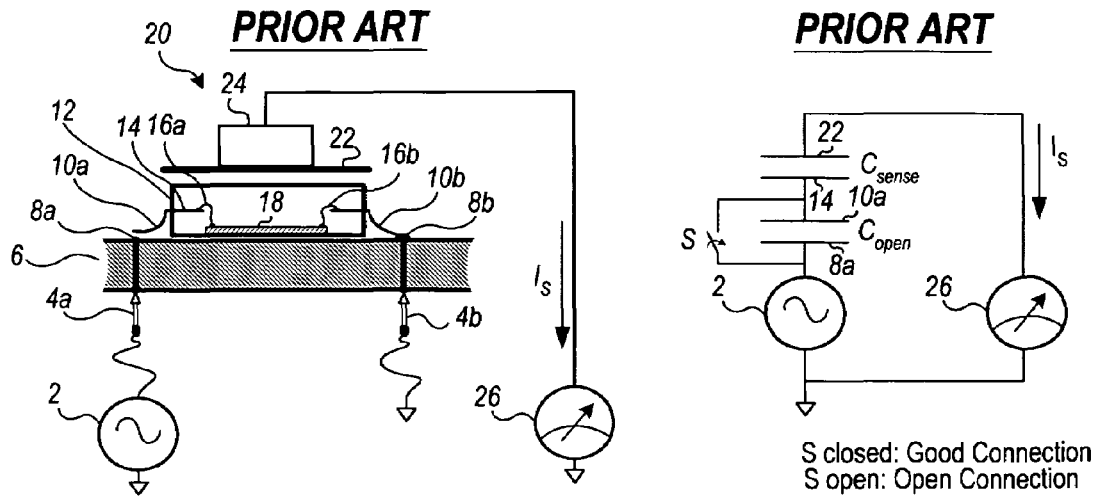
FIG. 1A     FIG. 1B
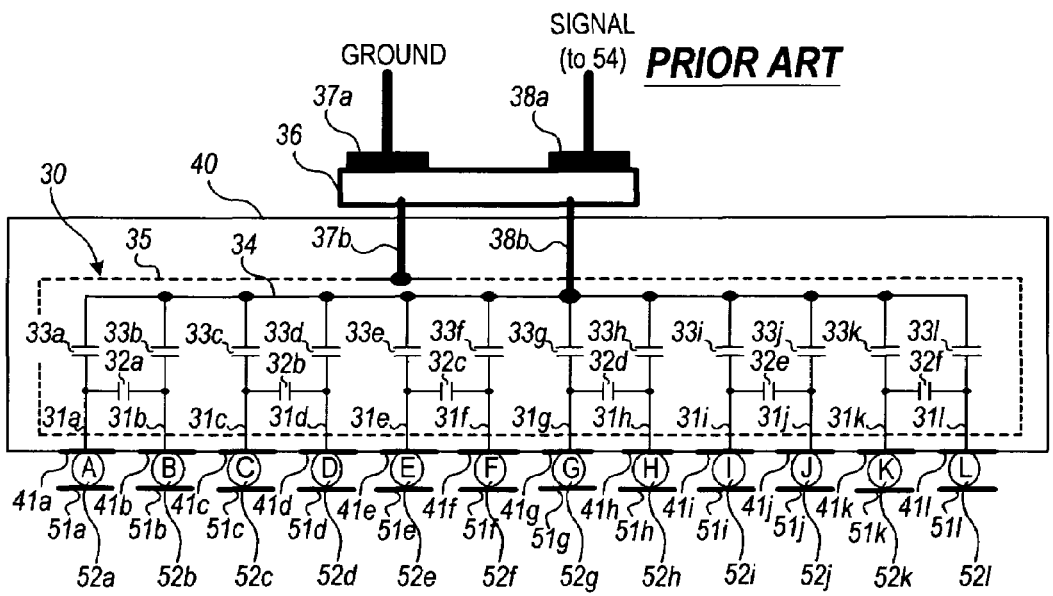
FIG. 2A     FIG. 2B

METHOD FOR DIAGNOSING OPEN DEFECTS ON NON-CONTACTED NODES OF AN ELECTRONIC DEVICE FROM MEASUREMENTS OF CAPACITIVELY COUPLED NODES

BACKGROUND OF THE INVENTION

The present invention relates generally to continuity testing of electronic devices, and more particularly to a method for diagnosing open defects on non-contacted nodes of an electronic device from measurements obtained from nodes of the electronic device that are capacitively coupled to the non-contacted nodes.

Integrated circuit assemblies are ubiquitous in modern electronic devices, and a large portion of the industrial sector is devoted to the design and manufacture of such devices. As electronic devices are continually being improved and becoming more sophisticated, so are consumers' expectations for the level of quality of these products. Accordingly, new and improved testing techniques are continuously being sought by manufacturers to test the quality of integrated circuits, printed circuit boards, and integrated circuit assemblies after manufacture and prior to shipment of these devices. While testing entails checking many aspects of the product, such as functionality testing and burn-in testing, one of the most important tests after manufacture is basic continuity testing—that is, testing to ensure that all connections that are supposed to be connected between components of the device (e.g., integrated circuit pins to printed circuit boards, integrated circuit lead wires to pins, traces connections between printed circuit board nodes, etc.) are intact.

One common defect often uncovered during continuity testing is known as an "open" defect. In an open defect, an electrical connection is missing between two points in the circuit where electrical continuity should exist. Open defects typically result from problems in the manufacturing process, such as missing solder due to uneven application of solder paste, the unintentional introduction of particles in the wetting process, etc. Thus, during continuity testing of integrated circuit assemblies, connection defects such as open solder joints are diagnosed.

Detection of open defects is often performed using well-known capacitive lead-frame sensing technologies. For example, U.S. Pat. No. 5,557,209 to Crook et al, U.S. Pat. No. 5,420,500 to Kerschner, and U.S. Pat. No. 5,498,964 to Kerschner et al., all of which are hereby incorporated by reference for all that they teach, describe techniques for detecting opens between integrated circuit signal pins and the mounting substrate (typically a printed circuit board). FIG. 1A shows the basic setup and FIG. 1B shows the equivalent circuit model of capacitive lead-frame testing for open signal pins on an integrated circuit.

As shown, an integrated circuit (IC) die 18 is packaged in an IC package 12. The package 12 includes a lead frame 14 supporting a plurality of pins 10a, 10b. Pads of the IC die 18 are connected to the package pins 10a, 10b at the lead frame 14 via bond wires 16a, 16b. The pins 10a, 10b are supposed to be conductively attached, for example by way of solder joints, to pads 8a, 8b of a printed circuit board (PCB) 6. The test setup shown in FIG. 1A determines whether package pins are properly connected to the board at the solder joints. The test setup includes an alternating current (AC) source 2 that applies an AC signal, through a test probe 4a, to a node connected to the pad 8a on the PCB 6 to which a pin under test 10a should be electrically connected. In a typical test environment, the AC signal is typically ten kilohertz (10 kHz) at 0.2 volts. A capacitive sensing probe 20 comprising a conductive sense plate 22 and amplifying buffer 24 is placed on top of the integrated circuit package 12. The capacitive sensing probe 20 is connected to a current measuring device 26, such as an ammeter. Another pin 10b of the integrated circuit 12 is connected to a circuit ground via a grounded probe 4b.

When the test is performed, the AC signal applied to pad 8a appears on the pin 10a of the integrated circuit package 12. Through capacitive coupling, in particular a capacitance $C_{sense}$ formed between the lead frame 14 and sense plate 22, a current $I_s$ is passed to the sense plate 22 and then through the amplifying buffer 24 to the current measuring device 26. If the measured current $I_s$ falls between predetermined limits, then the pin 10a is properly connected to the pad 8a. If the pin 10a is not connected to the pad 8a, a capacitance $C_{open}$ is formed between the pad 8a and pin 10a, altering the current $I_s$ measured by the current measuring device 26 such that the measured current $I_s$ falls outside the predetermined limits, thereby indicating that an open defect is present at the pin connection.

U.S. patent application Ser. No. 10/703,944 to Parker at al., entitled "Methods And Apparatus For Testing And Diagnosing Open Connections For Sockets And Connectors On Printed Circuit Boards", hereby incorporated by reference for all that it teaches, extends the capacitive leadframe testing concept to allow the testing of large sockets and connectors, especially when they contain large numbers of pins that are connected to ground and power planes, in particular, this technology creates a "Matched Capacitor Array" ("MCA") device 30, shown in FIG. 2A, that fits into a connector 40 to be tested. The MCA device 30 includes a plurality of pins 31a–31l that contact corresponding respective sockets 41a–41l of the connector 40. The sockets 41a–41l are supposed to be connected to pads 51a–51l of a PCB via joints 52a–52l, represented also as balls A–L, and it is typically the integrity of these joints 52a–52l that is being tested. Each pin 31a–31l has a tiny, engineered capacitance (C) 33a–33l to a common sense plate 34 (surrounded by a Faraday shield 35) that is then fed to a current measuring device 54 (FIG. 2B). The signal pins 33a, 31c, 31e, 31g, 31i, 31k are paired by an engineered pairing capacitance 32a, 32b, 32c, 32d, 32e, 32f to a respective neighboring power or ground pin 31b, 31d, 31f, 31h, 31j, 31l as shown in FIG. 2A.

The equivalent circuit for this configuration is shown for a capacitively coupled pair of pins 31a and 31b in FIG. 2B. In the illustrative example, the pair-coupling capacitance 32a has been set to 10*C. An AC source generator 52 applies an AC signal to the node 51a on the board to which the socket 41a should be connected. Current transferred to the common sense plate 34 of the MCA 30 is sensed by capacitive sensing probe 38 (FIG. 2A), which grounds the shield 35 via ground channel 37a, 37b. Sensed current on the common sense plate 34 is transferred to the current measuring device 54 over signal channel 38a, 38b. The input to the current measuring device 54 is a virtual ground. The sensed current is proportional to capacitance.

When no opens are present, the signal from signal generator 52 enters joint 52a (ball A). (Note the source impedance is small.) A voltage is developed at joint 52a (ball A). Joint 52b (ball B) is grounded, so the potential across joint 52b (ball B) is zero volts. Thus no current can flow from joint 52b (ball B) to the current meter 54. The value of capacitance measured is C.

If only joint 52a (ball A) is open, no signal will make it to the current meter 54, so the value measured is zero volts.

If only joint 52b (ball B) is open, the grounding of joint 52b (ball B) is prevented. Because the pair-coupling capacitor is much larger (10×) than C, the effective capacitive coupling to the current meter 54 is almost equal to C, resulting in an effective capacitance at the meter of approximately 2*C.

If both joints 52a and 52b (balls A and B) are open, the open on joint 52a (ball A) dominates the result, for a measurement of zero volts. TABLE 1 summarizes the measurement results:

TABLE 1

| Defect | Measured capacitance |
|---|---|
| None | C |
| Ball A open | 0 |
| Ball B open | 2*C |
| Ball A and B open | 0 |

In this example, the capacitance measurements are differentiated by at least a value of C. As long as the current meter 54 is sensitive over a range of 0 to 2*C, open defects are detectable and can be diagnosed.

The well-known capacitive lead-frame sensing technology mentioned above has for years used the information from TABLE 1 to detect open connections on nodes. A low capacitive measurement indicates that the contacted joint 52a connection at ball A is open. However, previously, no test technique determined open connections on the grounded joint 52b at ball B. Furthermore, no prior art test technique detects opens on node B without actually contacting node B. However, in many electronic devices, not all nodes are accessible for testing. Accordingly, it would be desirable to develop a testing technique for diagnosing open defects on inaccessible or non-contacted nodes of an electronic device.

SUMMARY OF THE INVENTION

The present invention is a method for diagnosing open faults on non-contacted nodes of an electrical device based on corresponding actual and expected measurements and a capacitive node coupling relationship model of the electrical device. Preferably the corresponding actual and expected measurements are obtained using capacitive sensing techniques, for example by stimulating various nodes of the electrical device that have known capacitive coupling to various non-contacted nodes of the electrical device with a known source signal, and capacitively sensing respective signals on the stimulated nodes through the package of the electrical device. The method of the invention determines whether corresponding actual measurements differ significantly from their expected measurements, and, based on the capacitive node coupling relationship model and knowledge of the corresponding actual versus expected measurements, determines which non-contacted nodes exhibit an open defect condition.

In a preferred illustrative embodiment, detection of nodes whose measurements differ from that expected is determined through a linear regression analysis. In this regard, pairs of expected and actual measurements are analyzed using linear regression to account for difference in measurements due to differences in offset and gain between measurements taken on devices of identical design, and pins whose measurements are outside that expected, are identified.

Also in a preferred illustrative embodiment, detection of open defects on non-contacted nodes of the electronic device is determined using a weighting scheme.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 1A is a schematic block diagram of a prior art capacitive lead-frame testing technique for diagnosing open signal pins on an integrated circuit;

FIG. 1B is a schematic diagram of the equivalent circuit model of the test setup of FIG. 1A;

FIG. 2A is a schematic block diagram of a test setup of a prior art matched capacitor array testing technique for diagnosing non-contacted open signal pins on an electrical connector;

FIG. 2B is a schematic diagram of the equivalent circuit model of the test setup of FIG. 2A;

DETAILED DESCRIPTION

Figure 3:
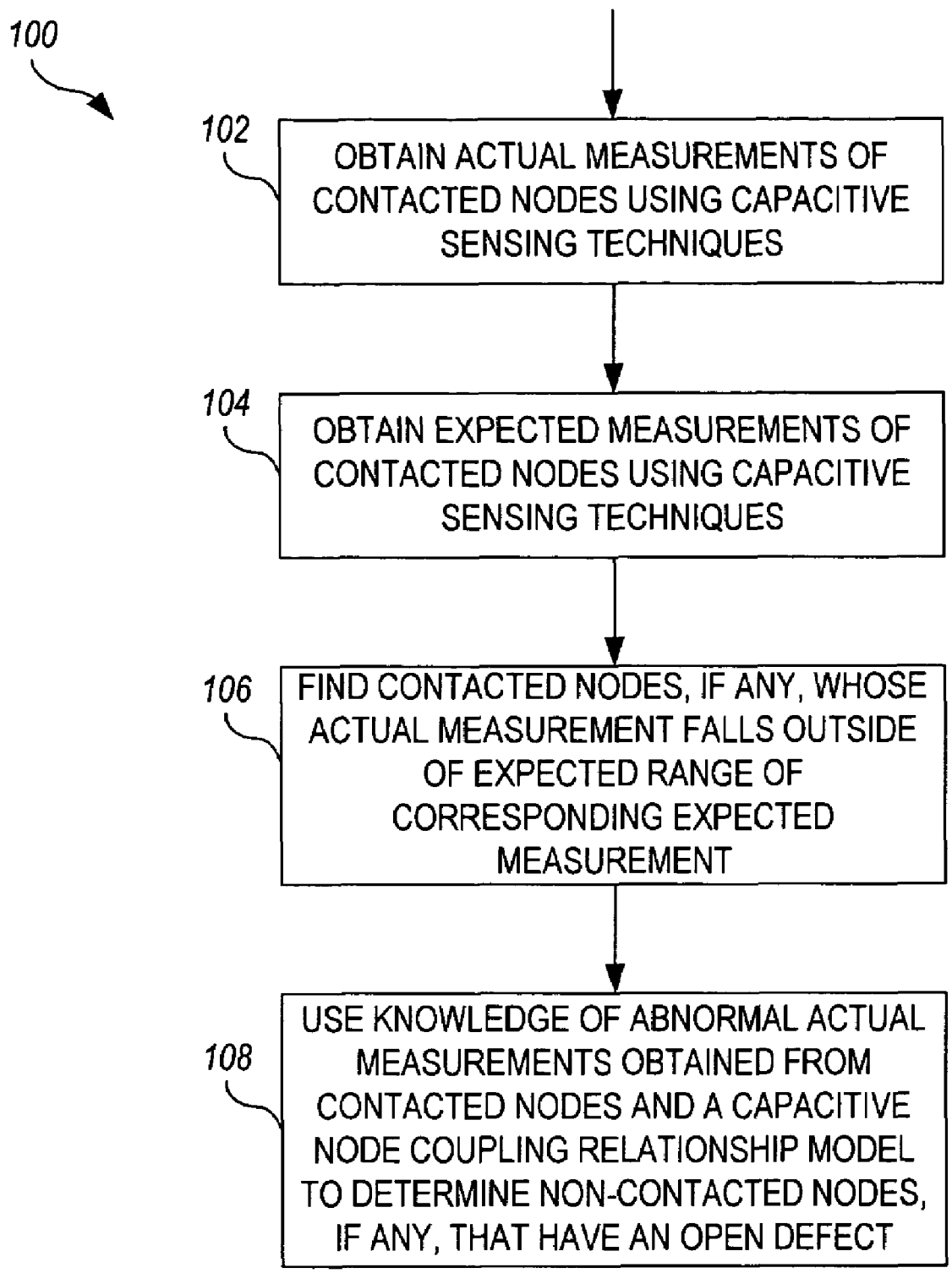
FIG. 3 is a flowchart illustrating the steps of a preferred method of the invention.

As used herein, the term "node" refers to the conductive portion of an electrical device that forms a single electrical point in the equivalent schematic diagram of the electrical device. For example, a node can be a pad of an integrated circuit die, a pin, a wire, a solder bump, or other interconnecting joint of an integrated circuit device, a pad or trace of a printed circuit board, an interconnecting joint of a component on the printed circuit board, or any combination thereof.

The present invention will be described in detail with reference to illustrative embodiments wherein the device under test is a connector socket and the nodes-under-implicit-test (or "non-contacted nodes") and stimulated nodes (or "contacted" nodes) are input and/or output joints (taking the form of solder beads) connecting the individual sockets of the connector to a printed circuit board. Accordingly, the term "joint" and "node" may be used interchangeably in the context of the illustrative embodiments. It will also be appreciated that the present invention may be similarly applied to electrical continuity testing of other types of electrical devices or circuit components (e.g., integrated circuits) and nodes therein. The illustrative embodiments are presented by way of example only and not limitation, and it is intended that the invention be limited only by the claims.

The present invention exploits capacitive sensing technology to diagnose open defects on non-contacted nodes of an electrical device based on measurements obtained from capacitively sensed signals on nodes of the electrical device that have known capacitive coupling to the non-contacted nodes. More particularly, the invention is applied to pins of an integrated circuit, wherein open connections on non-contacted pins (e.g., between the pin and printed circuit board or between the lead frame within the integrated circuit and pin) are detected using the measurements obtained, via capacitive sensing techniques, from surrounding contacted pins. The measuring technique for obtaining measurements used to diagnose open connections on non-contacted pins (such as node B in FIG. 2B and TABLE 1) using the measurements from the surrounding contacted pins (such as node A in FIG. 2B and TABLE) in the present invention is described in detail in U.S. patent application Ser. No. 10/836,862 to Parker et al., entitled "Methods And Apparatus For Non-Contact Testing And Diagnosing Open Connections For Connectors On Printed Circuit Boards", hereby incorporated by reference for all that it teaches.

The present invention describes an algorithm for diagnosing open defects on nodes of an electrical device given measurements of surrounding nodes. In the preferred embodiment, the algorithm is implemented as software that is executed on a computer system. In the illustrative embodiment, the electrical device is a single-row socket connector attached to a printed circuit board by way of solder joints connecting pins of the integrated circuits to pads on the printed circuit board. In this embodiment, the measurements of the contacted nodes are preferably obtained by a printed circuit board tester using capacitive sensing techniques.

FIG. 3 is a flowchart illustrating one embodiment of a method 100 of the invention for diagnosing open faults on non-contacted nodes of an electrical device. Inherent in the success of the method 100 is that each of the non-contacted nodes of the electrical device has a known capacitive coupling coupled to one or more contacted nodes of the electrical device. Furthermore, various contacted nodes of the electrical device also have known capacitive couplings to one or more other contacted nodes of the electrical device. These known capacitance values of the capacitive couplings between contacted and non-contacted nodes of the device is captured in a capacitive node-coupling relationship model, or as used hereinafter, simply "relationship model". As illustrated in FIG. 3, a set of actual measurements obtained from the device under test are obtained, received, or otherwise accessed (step 102). The measurements are typically obtained using capacitive sensing techniques such as those discussed in conjunction with FIGS. 1A, 1B, 2A, and 2B. In particular, for each non-contacted node of interest, a node of the electrical device that is capacitively coupled to the node of interest is contacted and stimulated with a known source signal, and a signal present on the contacted node is capacitively sensed through the device package by an AC detector to generate an actual measurement associated with the contacted node. The actual measurement may be the value of the measured parameter of the signal (e.g., current), or may be the value of another parameter derived from the measured parameter (e.g., capacitance derived from measured current).

Referring again to the method 100 in FIG. 3, a set of expected measurements corresponding to the actual measurements obtained from the device under test are obtained, received, or otherwise accessed (step 104). The expected measurements are typically obtained by performing the identical test on a known good board (i.e., a device that is known to have good connections on all contacted and non-contacted nodes), although other techniques such as theoretical calculation given the device design and using standard circuit theory may be used. The expected measurements correspond to the expected values of the actual measurements to be obtained.

The method 100 utilizes the expected measurements and the actual measurements to determine whether the actual measurements of the nodes differ from that expected, and to which contacted nodes, if any, these unexpected or "abnormal" measurements correspond (step 106).

Using the capacitive node coupling relationship model and knowledge of the actual versus expected measurements, the method 100 then determines whether any of the non-contacted nodes of the electrical device are likely to have an open defect (step 108).

Figure 4:
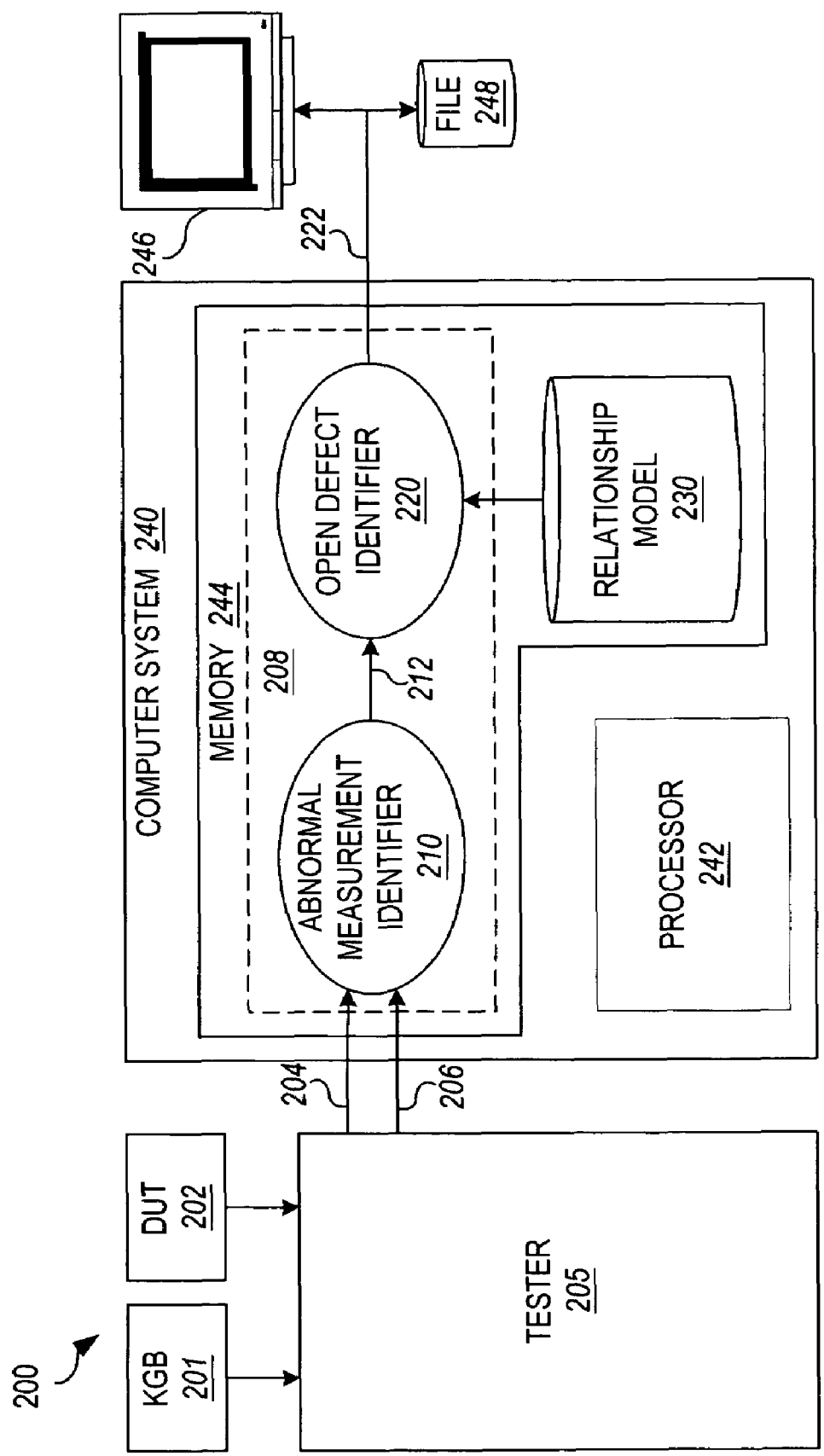
FIG. 4 is a block diagram illustrating a test environment in which the method of the invention may be implemented.

FIG. 4 is a block diagram of a test environment 200 in which the invention may be implemented. As illustrated, the test environment 200 includes a tester 205 which obtains actual measurements 204 representative of capacitance on nodes of a device under test 202. In the preferred illustrative embodiment, the tester 205 is an Agilent 3070 In-Circuit Test (ICT) Tester with Vectorless Test Extended Performance (VTEP) capacitive sensing probes installed. The ICT tester 205 obtains measurements on nodes of a device under test 202 according to the test setup shown in FIG. 2B.

A set of expected measurements is obtained, preferably using a "known good board" 201 with the same test setup and test as will be used on the device under test 202. As known in the art, a "known good board" 201 is an electronic device of identical design as the device under test 202 but is known to be "good" for all aspects of the characteristic being tested for. In the illustrative example, the known good board 201 is known to have all connections intact. The set of "good" measurements obtained from the known good board 201 forms a baseline set of measurements 206 representing the signature of the device 202 design. The set of expected measurements 206 will typically be the baseline set of measurements plus a predetermined allowable margin of error to account for differences in gain and offset between testers 205 and devices 202.

The actual measurements 204 and expected measurements 206 are fed to a computer system 240 for analysis. The analysis can be performed in realtime (i.e., after the actual measurements are acquired but while the device under test 202 is still in the production line) or at a later time. The computer system 240 executes the method of the invention in the form of a computer algorithm 208, stored in computer memory 244 in the form of computer instructions and executed by a processor 242 according to standard computer processing techniques. For reasons discussed hereinafter, the algorithm 208 includes two modules—an abnormal measurement identifier 210 which identifies, for example as a list 212, nodes of the device under test 202 that exhibit abnormal measurements, and an open defect identifier module 220 that identifies non-contacted nodes of the device under test 202 that have or are likely to have an open defect based on the list 212 of nodes with abnormal measurements and a relationship model 230 that describes known capacitive coupling relationships between nodes of the device under test 202. The identified nodes 222 may be conveyed to the test operator via a display 246 and/or may be stored to a file 248 for other use.

Turning now in more detail to the invention, it will be observed from TABLE 1 that the measured capacitance goes up when ball B of FIGS. 2A AND 2B is open due to the pair-coupling capacitance 32a (10*C) between ball A and ball B. This capacitance is related to the geometry and proximity of nodes A and B relative to each other. In the prior art MCA of FIG. 2A, the capacitance values of the coupling capacitors 32a, 32b, 32c, 32d, 32e, 32f are known because the are engineered with those capacitance values by design. However, in many DUT designs, the capacitance values between node pairs will not be specifically engineered to a known capacitance value, and therefore these coupling capacitance values must be determined through empirical testing, preferably on known good boards 201. The capacitance values between node pairs must be known and are preferably preserved in a relationship model 230 in order for the invention to be used. In devices that are not specifically engineered with predetermined known coupling capacitance values, some node pairs will have a significant amount of coupling capacitance while others will have relatively little. As just described, these relationships must be understood for a proper diagnosis of opens on the non-contacted nodes. For pin and socket connectors, this coupling capacitance is greatest for pin or socket pairs that are physically close to each other (e.g., adjacent, across, diagonally). As pins/sockts are separated from each other, the coupling capacitance falls off rapidly. The amount of capacitive coupling influences how much a measurement will rise due to an open connection on a non-contacted pin/socket. These same kinds of relationships also occur within many other electrical devices such as integrated circuits (ICs). However, it should be noted that use of a simple node adjacency analysis may be insufficient for determining the capacitive coupling relationships of a given electrical device such as integrated circuit due to the complex routing of signals inside the IC. If these relationships can be determined, for example via measurements on a known good board, the method 100 will also work for diagnosing opens on nodes of these other devices.

The overall solution of the invention can be broken down into two main stages. First, "abnormal" nodes 212 whose capacitive measurements are different enough from the value expected to indicate an adjacent open are identified. Second, knowledge of the abnormal nodes is used in conjunction with the relationship model 230 to diagnose which nodes are likely to have open defects.

Figure 5:
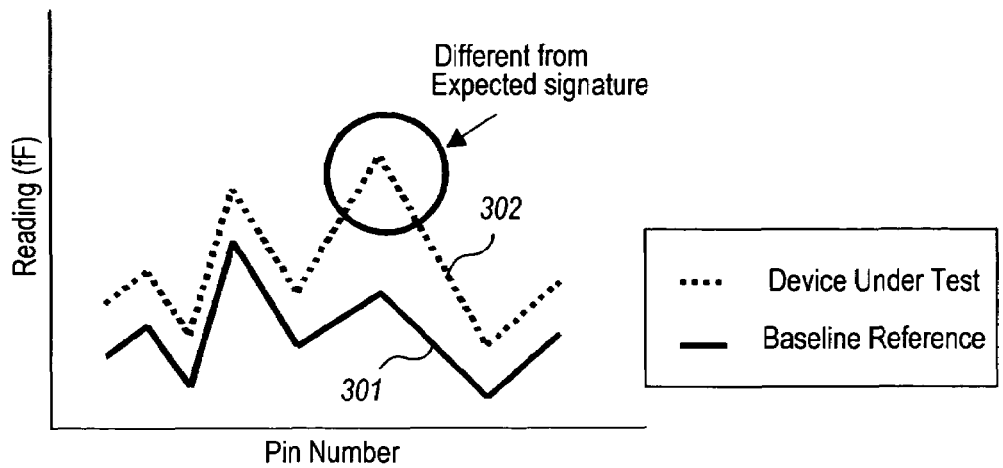
FIG. 5 is a graph of capacitive measurement readings plotted against pin numbers of an example electrical device.

The collection of capacitance values derived from the measurements of a given device forms a type of design signature. The design signature is essentially identical for all copies of the same device because the capacitance is a strong function of the mechanical characteristics of the device. While the measurements between devices of the same design may be different in gain and offset as compared to the reference baseline, the fundamental signature is the same. When an open defect on a non-contacted node is present, it causes the capacitance measurement of one or more neighboring nodes to read higher than expected. FIG. 5 shows capacitive measurements for the pins of an example device plotted against the pin number for both a baseline (line 301) and a device being tested (line 302). The pins corresponding to capacitive measurements that are higher than expected must be identified.

Many methods are possible for comparing the two signatures and selecting the set of pins whose measurements are different from those expected. In the preferred embodiment, the abnormal measurement identifier 210 is implemented using a linear regression analysis technique.

For a given pin number i the expected baseline value $x_i$ and the actual measurement $y_i$ forms an (x,y) pair. If the relationship between two sets of data (x and y) is linear, when the data is plotted (y versus x) the result is a straight line. This relationship is known as having a linear correlation and follows the equation of a straight line y=mx+b. For the case where there are no faults, the collection of $(x_i, y_i)$ pairs for all pins n approximates a straight line. Pins whose readings are more than some threshold away from this straight-line approximation can be deemed as different.

If a set of data is expected to have a linear correlation, as in the present case of expected versus actual measurements, the constants m (slope) and b (y-intercept) of the equation y=mx+b may be calculated analytically by applying a statistical process known as linear regression to the data.

Given a set of data $(x_i, y_i)$ with n data points, the slope m and y-intercept b can be calculated as follows:

$$m = \frac{n\sum (xy) - \sum x \sum y}{n\sum (x^2) - (\sum x)^2}$$

$$b = \frac{\sum y - m\sum x}{n}$$

(Note that the limits of the summation, which are i to n, and the summation indices on x and y have been omitted.)

A correlation coefficient, r, which indicates the degree of reliability of the linear relationship between the x and y values may also be calculated. A value of r=1 indicates an exact linear relationship between x and y. Values of r close to 1 indicate excellent linear reliability. If the correlation coefficient is relatively far away from 1, the predictions based on the linear relationship, y=mx+b, will be less reliable.

Given a set of data $(x_i, y_i)$ with n data points, the correlation coefficient, r, can be determined by $$r = \frac{n\sum (xy) - \sum x \sum y}{\sqrt{[n\sum (x^2) - (\sum x)^2][n\sum (y^2) - (\sum y)^2]}}$$

Figure 6:
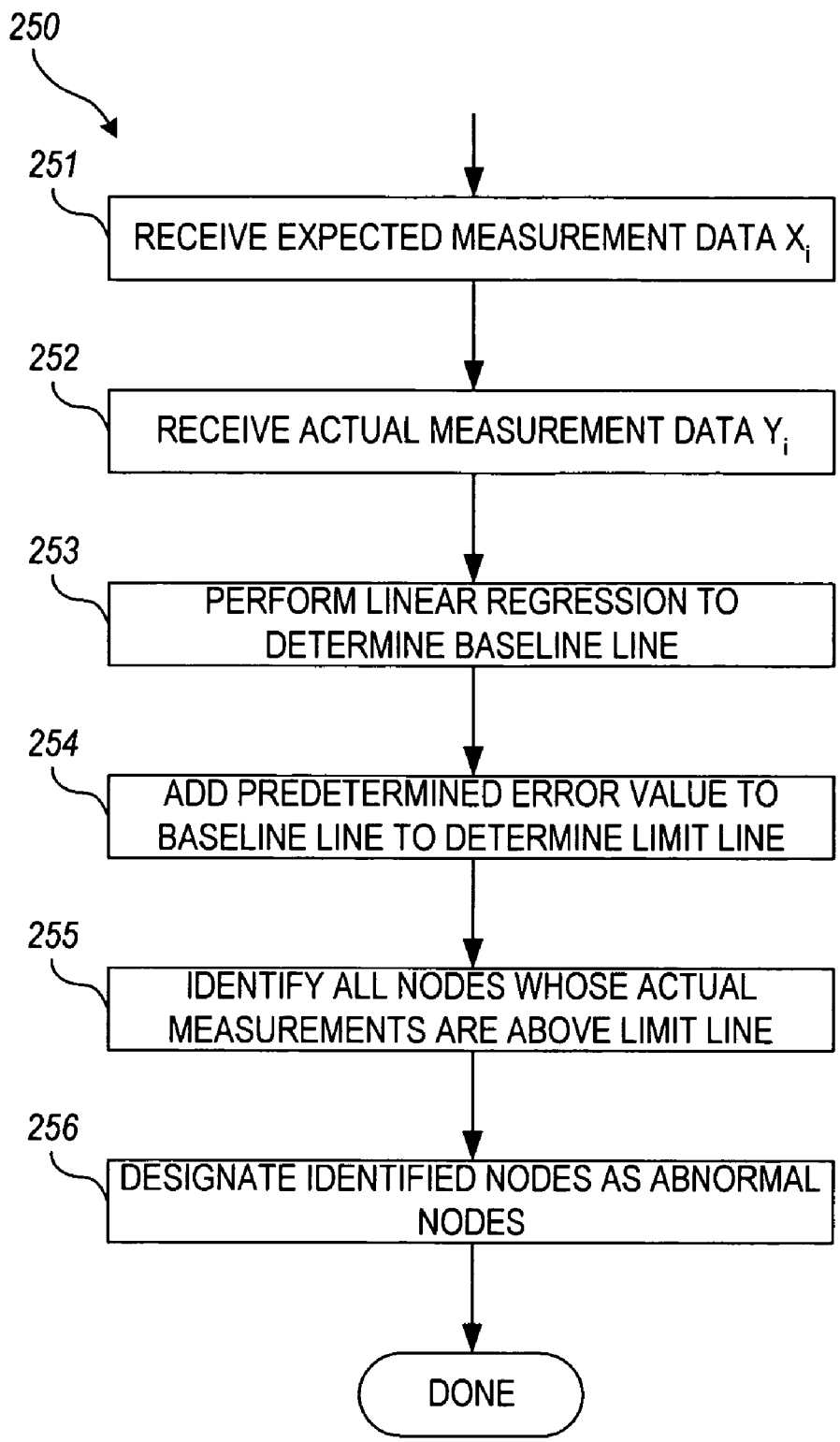
FIG. 6 is a flowchart illustrating an example linear regression analysis technique that may be used to identify pins having abnormal measurements.

FIG. 6 is a flowchart illustrating a method 250 that utilizes linear regression to identify nodes measuring abnormally. This method 250 may be used to implement the abnormal node identifier 210 of FIG. 4. As shown therein, the method 250 operates to receive expected measurement data $x_i$ (step 251) and actual measurement data $y_i$ (step 252). A linear regression is performed on the data pairs $(x_i, y_i)$ to determine the equation y=mx+b of the baseline line, for example using the equations for the slope m and y-intercept b defined above (step 253). A predetermined acceptable amount of error $\epsilon$ is then added to the baseline line equation to determine the equation y=mx+b+$\epsilon$ of a limit line (step 254). The method 250 then determines all, if any, nodes whose actual measurement $x_i$ lies above the limit line (step 255), and designates these identified nodes as "abnormal" nodes (step 256) (for example by placing the node identifier into a designated list 212 of "abnormal" nodes).

Figure 7:
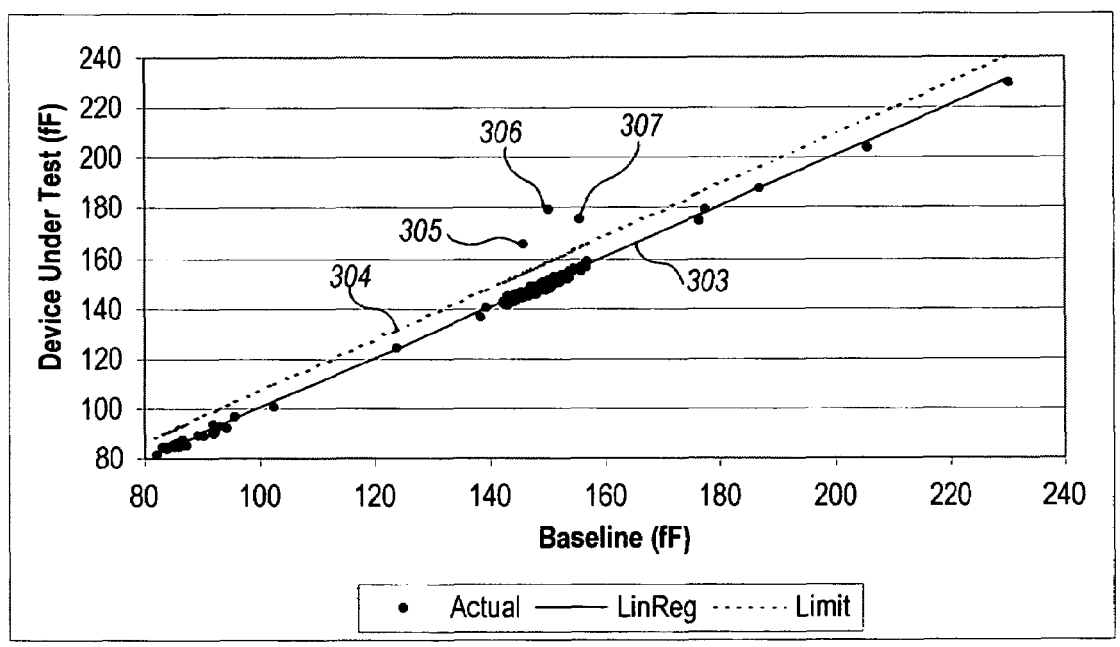
FIG. 7 is a graph of the capacitance measurements obtained for an example electrical device plotted against the baseline measurements, illustrating an example linear regression technique.

FIG. 7 illustrates an example of an actual data set collected for an electronic device and the plot of a "best-fit" straight line through the data. In the example data set shown in FIG. 7, the straight-line approximation line 303 and a limit line 304 (representing an acceptable amount of error). Data points corresponding to pins herein identified as 305, 306, and 307 lie above the limit line 304, indicating that the actual measurements obtained for these pins were outside the expected range, or had "abnormal" values (and are referred to herein as "abnormal pins").

One advantage to use of a linear regression analysis technique for the abnormal measurement identifier 210 is that it automatically compensates for differences in gain and offset between the baseline and the device under test. When the linear regression is performed, the calculated gain (slope m) and offset (y-intercept b) compensate for these differences. These gain and offset errors come from a variety of sources such as temperature, mechanical differences between connectors, and differences in materials used to construct the connectors.

The list 212 of abnormal pins generated by the abnormal measurement identifier module 210 (implemented in the preferred illustrative embodiment with a linear regression analyzer 215) is used in conjunction with the relationship model 230 to indict non-contacted pins that are or are likely to be open. In the preferred illustrative embodiment, a weighting scheme is used to identify the non-contacted pins with open defects. The relationship model 230 stores data representing the degree of coupling between two nodes. As an example, let the degree of coupling be grouped into bins with strong, medium, weak and no amounts of coupling. Varying weights are assigned to each of these bins, preferably assigning higher weight to stronger coupling.

Figure 8:
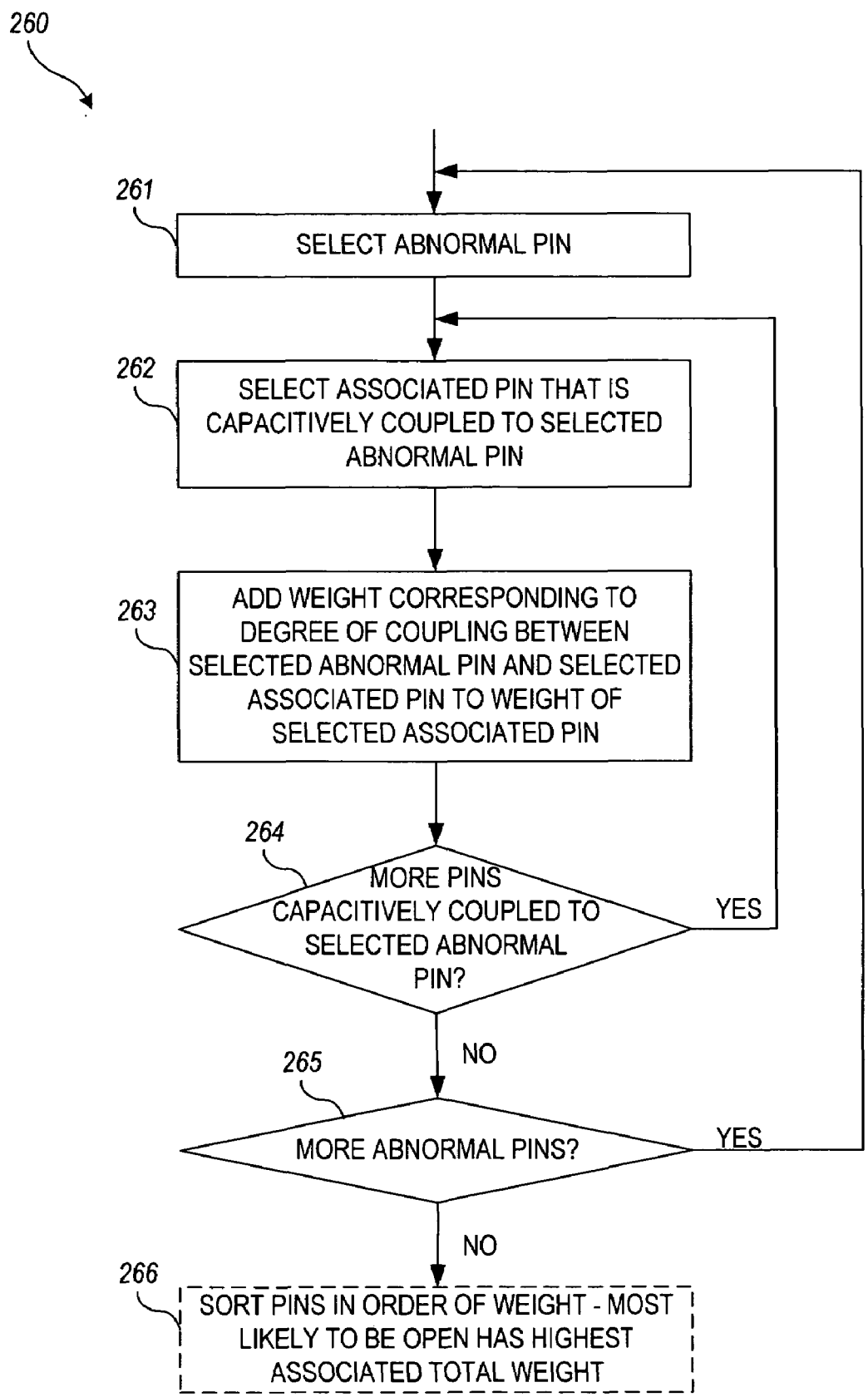
FIG. 8 is a flowchart illustrating an example weighting scheme that may be used to identify pins with open defects.

FIG. 8 is a flowchart illustrating an example method 260 that employs a weighting scheme that may be used to implement the open defect identifier 220 of the invention. As shown, for each node in the abnormal node list 212 that is identified as having an abnormal measurement (as selected in step 261), the relationship model 230 is consulted to select a node that is capacitively coupled to it (step 262). Then, the appropriate amount of weight corresponding to the degree of coupling between the selected node and selected abnormal node is added to a total weight associated with the selected node (step 263). Once all of the nodes in the list 212 of abnormal nodes have been iterated through (as determined in step 265), the total weight associated with each node represents the degree of likelihood that the node has an open defect. The nodes can be sorted by magnitude of associated total weight to give a prioritized list 222 of possible open nodes in order of most likely to be open to least likely to be open (step 266). Further isolation can be achieved by excluding from the opens list 222 any nodes that themselves were tested directly (contacted) and passed (i.e., were determined not to be open).

Figure 9:
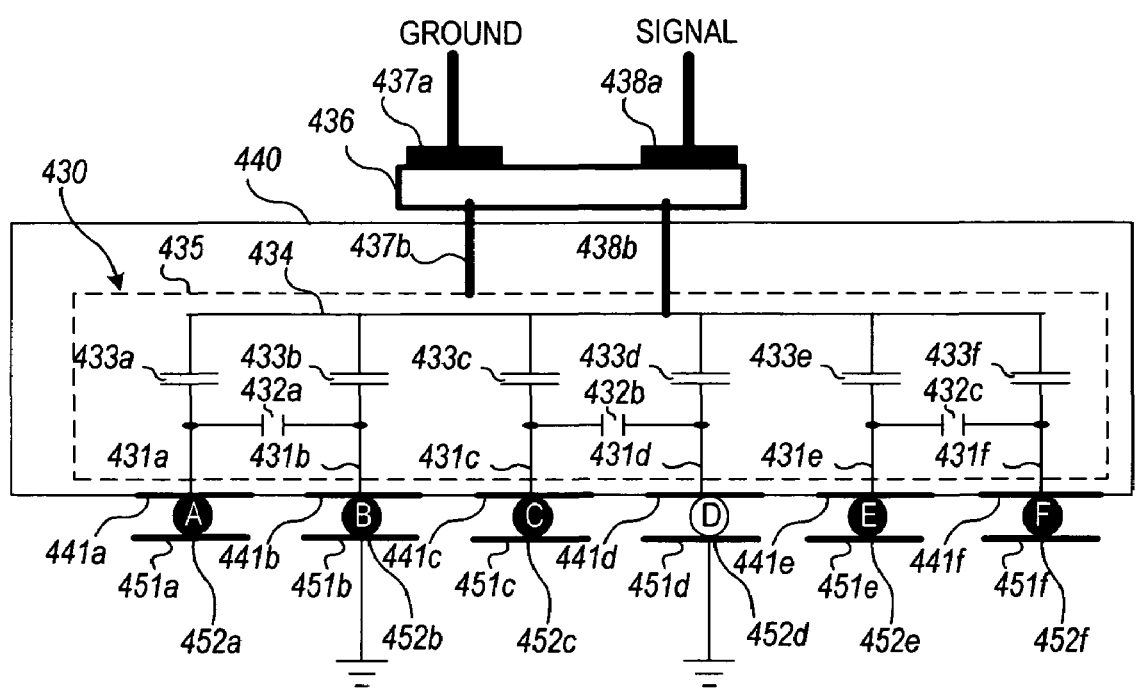
FIG. 9 is an example six-pin single-row connector.

To illustrate the use of weighting for determining pin open faults in non-contacted pins, consider the single-row six-pin connector 440 shown in FIG. 9. In this example, pins 431a, 431c, 431e, 431f (balls A,C,E,F) are signal pins that are contacted, stimulated, and measured using the technique shown in FIG. 2A. Pins 431b and 431d (balls B and D) are grounded and not measured. In this example, non-contacted pin 431d (ball D) has an open defect.

To simplify the example, assume a single-valued weighting system. In this simple weighting scheme, a single weight of 1 is assigned only to adjacent pins. Using this weighting system, a relationship model for the connector can be developed. For example, the relationship model for the connector of FIG. 9 using the single-value weighting scheme just described may be represented as shown in TABLE 2 as a two-dimensional array with the row index representing the pin identifier and the column index representing the identifier of other pins. The cell at the intersection of each row and column comprises the amount of capacitive coupling between the pins identified by the row and column indexes. For the single-valued weighting system just described, a 1 may be placed in the cells for those pin pairs that have capacitive coupling (e.g., adjacent pins). (Note: For a multi-valued weighting system, various weight values can be used instead of the single value 1.) For the connector 430 of FIG. 9, assume that each pin 431a, 431b, 431c, 431d, 431e, 431f, couples to the adjacent pins on either side but to no others. The resulting relationship model array is shown in TABLE 2 below:

TABLE 2

| Relationship Model | | Coupled Pins | | | | | |
|---|---|---|---|---|---|---|---|
| | | A | B | C | D | E | F |
| Pin | A | X | 1 | 0 | 0 | 0 | 0 |
| | B | 1 | X | 1 | 0 | 0 | 0 |
| | C | 0 | 1 | X | 1 | 0 | 0 |
| | D | 0 | 0 | 1 | X | 1 | 0 |
| | E | 0 | 0 | 0 | 1 | X | 1 |
| | F | 0 | 0 | 0 | 0 | 1 | X |

For purposes of example, further assume that TABLE 3 summarizes the baseline reference (i.e., expected) measurements:

TABLE 3

| Pin | A | B | C | D | E | F |
|---|---|---|---|---|---|---|
| Measurement | 100 | G | 120 | G | 87 | 134 |

Assuming that pin 431d (ball D) is open, pins 431c and 431e (balls C and E) will measure higher than expected according to the theory described above. Let the following table represent the measurements for the device being tested.

TABLE 4

| Pin | A | B | C | D | E | F |
|---|---|---|---|---|---|---|
| Measurement | 103 | G | 160 | G | 101 | 131 |

A linear regression on this set of data generates a slope m of 0.65 and a y-intercept b of 56.5. A margin of error (for example, 5.0) can be added to the y-intercept to create an upper limit function. Therefore, the equation (y=mx+b) representing the upper limit is:

$$goodvalue <= 0.65*baseline + 61.5$$

Using this equation to calculate an upper value that is considered good and comparing against the measured values shows that pins 431c and 431e (balls C and E) are higher than expected. These two pins 431c and 431e (balls C and E) are then added to a list 212 of abnormal pins to indicate a possible problem.

The list 212 of abnormal pins (comprising identifiers for pins 431c and 431e) that are considered to be measuring too high may be used in conjunction with the relationship model in TABLE 2 to determine which non-contacted pins 431b, 431d might be open. To do this we start with an array indexed by the pin number (the opens array) and initialize each value to 0. Then pin 431c (ball C) is used as the row index in the relationship model array above and the weight for each pin in that row is added to the corresponding location in the opens array. This is repeated for pin 431e (ball E) (i.e., all capacitively coupled pins whose actual measurements are deemed too high). When done, the opens array contains values greater than zero for any pins that might be open. The value for each pin represents the likelihood for that pin being open. The resulting opens array is shown in TABLE 4 below:

TABLE 4

| | Opens Array | | | | |
|---|---|---|---|---|---|
| Pin/Use | A/signal | B/Gnd | C/signal | D/OpenGnd | E/signal | F/signal |
| Weight | 0 | 1 | 0 | 2 | 0 | 1 |

Since pin 431f (ball F) is a signal pin and was measured directly, pin 431f (ball F) can be excluded from the analysis, resulting in the list of possibly open pins containing pins 431b and 431d (balls B and D). Pin 431d (ball D) is more likely to be open due to its larger weight value. One of the initial assumptions for this example is that pin 431d (ball D) was open. Therefore, the algorithm was successful in locating the open.

This weighting system can be further refined. Just as the pins whose actual measurements measure outside the norm of their corresponding expected measurements (herein termed "abnormal" pins) provide information, the pins whose actual measurements measure within the norm of their corresponding expected measurements (herein termed "normal" pins) also provide information about the non-contacted pins. Normal pins indicate that the pins near them (both contacted pins and non-contacted pins) are not likely to be open. The weighting system may then be modified to account for this knowledge by assigning negative weights for normal pins. Strong, medium, and weak negative weights can be added as described above. The use of negative weighting for normal pins reduces the weights of pins that are capacitively coupled to the normal pins since pins capacitively coupled to a pin that gives a measurement within the expected range is less likely to have an open default. The negative weighting scheme therefore results in a more accurate diagnosis.

To illustrate the use of negative weighting for normal pins using the example single row six-pin connector shown in FIG. 9, adjacent pins are again assigned a weight of 1, but an additional weight of −1 is added to the total weight associated with the pin pair if one or both of the pins of the pair measured within the expected range. Pins 431c and 431e (balls C and E) would still measure higher than expected. In like manner to above, the weight from the relationship model would be added to the opens array for pins coupled to pins 431c and 431e (balls C and E). Then for each passing pin 431a and 431f (balls A and F) the negative weight of −1 is added to each coupled pin. Ignoring pin 431f (ball F) again would yield a list of possible opens that indicts only pin 431d (ball D). Only positive values are considered open. This is summarized in TABLE 5.

TABLE 5

| | Opens Array | | | | |
|---|---|---|---|---|---|
| Pin/Use | A/signal | B/Gnd | C/signal | D/OpenGnd | E/signal | F/signal |
| Weight | 0 | 0 | 0 | 2 | −1 | 1 |

The technique for identification of open defects in non-contacted pins can be further improved. Since the effect of non-contacted opens is to always raise the measured value of the nearby contacted pins (signal pins), any analysis parameters (gain and offset for the linear regression example) will be distorted but in a predictable way. The amount of error is related to the number of opens present and the degree of capacitive coupling these pins have to the nearby signal pins. For the linear regression technique, the straight-line approximation for the case with opens present will be elevated above the case where no opens are present. Compensating for this source of error will lead to a more accurate approximation and, therefore, better diagnosis of non-contacted opens. Using the linear regression shown in FIG. 6 as an example, once the three pins 305, 306, 307 shown as abnormal are identified, the linear regression can be repeated omitting these data points. The remaining data points will give a more accurate approximation of the expected good values. The new straight-line approximation may then be used to select pins that are different from expected. This process of fine-tuning the analysis can be repeated if needed, and keeps a large number of opens from distorting the analysis enough to mask other opens with smaller amounts of coupling to their neighbors.

In summary, the present invention allows open defects on non-contacted pins to be detected and diagnosed by analyzing the measurements on adjacent pins. The presence of opens distorts the capacitively sensed measurements in a predictable way. Signal pins measuring higher than expected can be determined, for example using linear regression, even in the face of differences in gain and offset between devices of the same design. The technique of the present invention may be applied to signal pins, and also to power and ground pins which today are not tested. It can also be applied to other pins that are not contacted for some reason such as limited access.

While the analysis algorithm is most easily adapted to connectors and sockets with easily definable capacitive pin coupling relationships, it may also be applied to other electronic devices, such as integrated circuits, so long as a capacitive node coupling relationship model can be constructed.

Those of skill in the art will appreciate that while the invented technique for detecting and diagnosing open defects on non-contacted nodes based on capacitive sensing techniques, corresponding pairs of actual and expected measurements, and known capacitive coupling and corresponding capacitance values of pairs of nodes in the device, the techniques described and illustrated herein are preferably implemented wholly or in part in software comprising instructions running on a computer or other suitable hardware which executes the instructions, the instructions being stored for execution on a computer-readable medium.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A method for diagnosing open defects on nodes of an electrical device, the method comprising the steps of:

receiving a set of expected measurements indicative of respective expected capacitances on respective nodes of the electrical device;

receiving a set of actual measurements indicative of respective actual capacitances on the respective nodes of the electrical device;

receiving knowledge of capacitance coupling between the respective nodes of the electrical device and between the respective nodes of the electrical device and nodes of the electrical device for which measurements are not received;

identifying abnormal nodes, if any, corresponding to nodes of the electrical device whose respective actual measurements lie outside of an expected range of their respective corresponding expected measurements; and identifying indicted nodes, if any, corresponding to nodes of the electrical device that have or are likely to have an open defect, based on the identified abnormal nodes and the received knowledge of capacitance coupling.

2. The method of claim 1, wherein the step for identifying abnormal nodes comprises:

performing a linear regression on the actual measurements and the expected measurements to produce a regressed line;

and identifying abnormal nodes whose actual measurements do not fit the regressed line.

3. The method of claim 1, wherein the step for identifying indicted nodes comprises:

assigning relative weights to the nodes of the electrical device indicating a respective degree of coupling of the respective node to one or more abnormal nodes.

4. The method of claim 3, further comprising;

identifying indicted nodes as those nodes whose respective associated weight indicates a predetermined amount of capacitive coupling to an abnormal node.

5. The method of claim 2, wherein the step for identifying indicted nodes comprises:

assigning relative weights to the nodes of the electrical device indicating a respective degree of coupling of the respective node to one or more abnormal nodes.

6. The method of claim 5, further comprising:

identifying indicted nodes as those nodes whose respective associated weight indicates a predetermined amount of capacitive coupling to an abnormal node.

7. A computer readable storage medium tangibly embodying program instructions implementing a method for diagnosing open defects on nodes of an electrical device, the electrical device comprising a plurality of nodes that are variously capacitively coupled to one another according to a capacitive node coupling relationship model, the method comprising the steps of:

receiving a set of expected measurements indicative of respective expected capacitances on respective nodes of the electrical device;

receiving a set of actual measurements indicative of respective actual capacitances on the respective nodes of the electrical device;

receiving knowledge of capacitance coupling between the respective nodes of the electrical device and between the respective nodes of the electrical device and nodes of the electrical device for which measurements are not received;

identifying abnormal nodes, if any, corresponding to nodes of the electrical device whose respective actual measurements lie outside of an expected range of their respective corresponding expected measurements; and identifying indicted nodes, if any, corresponding to nodes of the electrical device that have or are likely to have an open defect, based on the identified abnormal nodes and the received knowledge of capacitance coupling.

8. The computer readable storage medium of claim 7, wherein the method step for identifying abnormal nodes comprises:

performing a linear regression on the actual measurements and the expected measurements to produce a regressed line;

and identifying abnormal nodes whose actual measurements do not fit the regressed line.

9. The computer readable storage medium of claim 7, wherein the method step for identifying indicted nodes comprises:

assigning relative weights to the nodes of the electrical device indicating a respective degree of coupling of the respective node to one or more abnormal nodes.

10. The computer readable storage medium of claim 9, the method further comprising the step of:

identifying indicted nodes as those nodes whose respective associated weight indicates a predetermined amount of capacitive coupling to an abnormal node.

11. The computer readable storage medium of claim 8, wherein the method step for identifying indicted nodes comprises:

assigning relative weights to the nodes of the electrical device indicating a respective degree of coupling of the respective node to one or more abnormal nodes.

12. The computer readable storage medium of claim 11, the method further comprising the step of:

identifying indicted nodes as those nodes whose respective associated weight indicates a predetermined amount of capacitive coupling to an abnormal node.

13. An apparatus for diagnosing open defects on nodes of an electrical device, comprising:

means for receiving a set of expected measurements indicative of respective expected capacitances on respective nodes of the electrical device;

means for receiving a set of actual measurements indicative of respective actual capacitances on the respective nodes of the electrical device;

means for accessing a relationship model, the relationship model comprising knowledge of capacitance coupling between the respective nodes of the electrical device and between the respective nodes of the electrical device and nodes of the electrical device for which measurements are not received;

an abnormal node identifier which identifies abnormal nodes, if any, corresponding to nodes of the electrical device whose respective actual measurements lie outside of an expected range of their respective corresponding expected measurements; and an open defect identifier which identifies indicted nodes, if any, corresponding to nodes of the electrical device that have or are likely to have an open defect, based on the identified abnormal nodes and the received knowledge of capacitance coupling.

14. The apparatus of claim 13, wherein the abnormal node identifier comprises:

a linear regression analyzer that performs linear regression on the actual measurements and the expected measurements to produce a redressed line and identifies abnormal nodes whose actual measurements do not fit the linear regression.

15. The apparatus of claim 13, wherein the open defect identifier comprises:

a weighting algorithm that assigns relative weights to the nodes of the electrical device indicating a respective degree of coupling of the respective node to one or more abnormal nodes.

16. The apparatus of claim 15, wherein:
the open defect identifier identifies indicted nodes as those nodes whose respective associated weight indicates a predetermined amount of capacitive coupling to an abnormal node.

17. The apparatus of claim 14, wherein the open defect identifier comprises:
a weighting algorithm that assigns relative weights to the nodes of the electrical device indicating a respective degree of coupling of the respective node to one or more abnormal nodes.

18. The apparatus of claim 17, wherein:
the open defect identifier identifies indicted nodes as those nodes whose respective associated weight indicates a predetermined amount of capacitive coupling to an abnormal node.

* * * * *

UNITED STATES PATENT AND TRADEMARK OFFICE
CERTIFICATE OF CORRECTION

| | | |
|---|---|---|
| PATENT NO. | : 7,057,395 B1 | |
| APPLICATION NO. | : 11/074238 | |
| DATED | : June 6, 2006 | |
| INVENTOR(S) | : Williamson | |

It is certified that error appears in the above-identified patent and that said Letters Patent is hereby corrected as shown below:

In column 13, line 26, in Claim 4, delete "comprising;" and insert -- comprising: --, therefor.

In column 14, line 59, in Claim 14, delete "redressed" and insert -- regressed --, therefor.

Signed and Sealed this

Thirtieth Day of January, 2007

JON W. DUDAS
*Director of the United States Patent and Trademark Office*